United States Patent
Komura et al.

(10) Patent No.: US 6,268,298 B1
(45) Date of Patent: Jul. 31, 2001

(54) METHOD OF MANUFACTURING SEMICONDUCTOR DEVICE

(75) Inventors: Atsushi Komura, Kariya; Takeshi Kuzuhara, Nukata-gun; Noriyuki Iwamori, Okazaki; Manabu Koike, Toyoake; Jiro Sakata, Aichi-gun; Hirofumi Funahashi, Aichi-gun; Kenji Nakashima, Aichi-gun; Masahiko Ishii, Aichi-gun, all of (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/265,528

(22) Filed: Mar. 9, 1999

(30) Foreign Application Priority Data

Mar. 10, 1998 (JP) .................................. 10-057771

(51) Int. Cl.⁷ ..................................... H01L 21/31
(52) U.S. Cl. .......................... 438/787; 438/297; 438/449
(58) Field of Search .................... 438/770, 773, 438/787, 758, 774, 294, 295, 297, 362, 447, 449, 452

(56) References Cited

U.S. PATENT DOCUMENTS

| | | |
|---|---|---|
| 4,626,450 | 12/1986 | Tani et al. . |
| 5,091,332 | 2/1992 | Bohr et al. . |
| 5,096,839 | 3/1992 | Amai et al. . |
| 5,244,843 * | 9/1993 | Chau et al. ..................... 437/239 |
| 5,677,208 | 10/1997 | Itou et al. . |

FOREIGN PATENT DOCUMENTS

| | | |
|---|---|---|
| 54-102964 | 8/1979 | (JP) . |
| 56-162850 | 12/1981 | (JP) . |
| 5-221786 | 8/1983 | (JP) . |
| 3-217019 | 9/1991 | (JP) . |
| 4-36457 | 6/1992 | (JP) . |
| 5-190850 | 7/1993 | (JP) . |
| 6-12801 | 2/1994 | (JP) . |
| 2-2843037 | 10/1998 | (JP) . |

OTHER PUBLICATIONS

"Oxygen Precipitation and OSF" pp. 199–220.
"VLSI Manufacturing Technology" Tokuyama & Hashimoto: Nikkei BP, pp. 61–63, Jan. 14, 1989.

* cited by examiner

Primary Examiner—Olik Chaudhuri
Assistant Examiner—Ginette Peralta
(74) Attorney, Agent, or Firm—Pillsbury Winthrop LLP

(57) ABSTRACT

In a method of manufacturing a semiconductor device, after performing ion-implantation and before forming an oxide film, a silicon substrate is disposed within a furnace to undergo a heat treatment at a temperature equal to or higher than 950° C. for a specific time period (equal to or longer than 15 minutes). When performing the heat treatment and when raising a temperature up to the heat treatment temperature, oxygen is supplied together with nitrogen gas (inert gas). A supply amount of oxygen is controlled to be equal to or less than 5% when raising the temperature up to the heat treatment temperature, and to be equal to or less than 2% when performing the heat treatment. After the heat treatment, the oxidation film is formed. As a result, crystal defects (OSFs) are prevented from being produced on the silicon substrate surface.

6 Claims, 8 Drawing Sheets

METHOD OF MANUFACTURING SEMICONDUCTOR DEVICE

CROSS REFERENCE TO RELATED APPLICATION

This application is based upon and claims the benefit of Japanese Patent Application No. 10-57771, filed on Mar. 10, 1998, the contents of which are incorporated herein by reference.

BACKGROUND OF THE INVENTION

1. Field of the Invention

This invention relates to a method of manufacturing a semiconductor device, and specifically to a technique for preventing stacking faults, especially, oxidation induced stacking faults (OSFs), from being generated on a silicon surface at a silicon oxidation step.

2. Description of the Related Art

Various kinds of crystal defects in LSIs have been widely studied and reported by many documents. Among these researches concerning crystal defects, a method for preventing crystal defects, especially OSFs from being produced after a heat treatment in an LSI manufacturing process is actively studied.

For instance, it is reported that OSFs are caused by (1) defects mechanically formed on a wafer surface, (2) metallic contaminations, (3) oxidized depositions, and the like. This kind of reports, however, only describe the occurrence causes of OSFs, and fail to teach how to control it. In addition, in many cases, OSFs are produced in combination with various factors in the LSI manufacturing process. Therefore, it is not always improved even if a teaching is adopted to the manufacturing process as it is reported.

JP-A-3-217019 discloses that it is effective to preheating a wafer before oxidation in order to prevent generation of OSFs, since the crystal defects are liable to be produced on the wafer when the wafer is oxidized with damages caused by ion-implantation or plasma treatment. However, according to experiments by the inventors of the present invention, the generation of OSFs was not prevented only by hearing. It is required to find out a specific controlling technique for preventing the generation of OSFs.

SUMMARY OF THE INVENTION

The present invention has been made in view of the above problem. An object of the present invention is to provide a method of manufacturing a semiconductor device, capable of effectively preventing crystal defects (OSFs) from being produced on a silicon substrate surface during a semiconductor manufacutirng process.

According to the present invention, in a method of manufacturing a semiconductor device including a step for forming an oxide film after implanting ions into a silicon substrate, the silicon substrate is disposed within a furnace after implanting ions and before forming the oxide film. Then, a heat treatment is carried out for a specific time period. When the heat treatment is carried out for the specific time period, or when a temperature is raised up to a heat treatment temperature, inert gas is supplied into the furnace together with oxygen. Accordingly, crystal defects (OSFs) can be effectively prevented from being produced on the silicon substrate surface in the semiconductor manufacturing process.

The heat treatment temperature is preferably equal to or higher than 950° C. An amount of oxygen that is supplied during the heat treatment is preferably equal to or less than 2%. Further, the specific time period of the heat treatment is preferably equal to or longer than 15 minutes. An amount of oxygen that is supplied when the temperature is raised up to the heat treatment temperature is preferably equal to or less than 5%. After the heat treatment is carried out for the specific time period, the oxide film can be formed within the same furnace.

DETAILED DESCRIPTION OF THE PREFERRED EMBODIMENTS

Herebelow, a preferred embodiment of the present invention will be explained referring to drawings.

Figure 7:
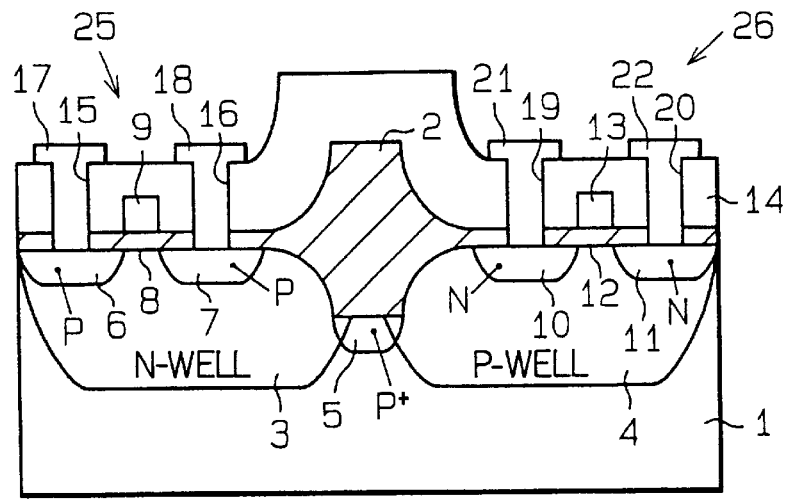
FIG. 7 is a cross-sectional view showing the semiconductor device.

FIG. 7 shows a cross-sectional view of a semiconductor device in the present embodiment. In FIG. 7, a P-channel MOSFET 25 and an N-channel MOSFET 26 are provided on a single crystal silicon substrate 1. Both elements 25, 26 are isolated from one another by a LOCOS film 2. Specifically, the LOCOS film 2 is formed in a surface portion of the single crystal silicon substrate 1, and an N-well region 3 and a P-well region 4 are provided in surface portions of the single crystal silicon substrate 1 with the LOCOS film 2 interposed therebetween. A P type channel stopper 5 is further provided under the LOCOS film 2. A source region 6 and a drain region 7 are provided in the N-well region 3, and a gate electrode 9 is disposed on the N-well region 3 through a gate oxide film 8. Likewise, a source region 10 and a drain region 11 are provided in the P-well region 4, and a gate electrode 13 is disposed on the P-well region 4 through a gate oxide film 12.

Further, the surface of the single crystal silicon substrate 1 is covered with a silicon oxide film (BPSG film) 14. In the P-channel MOSFET 25, contact holes 15, 16 are formed to pass through the silicon oxide film 14 and the gate oxide film 8, and wiring segments 17, 18 extend through the contact holes 15, 16, respectively. In the N-channel MOSFET 26, contact holes 19, 20 are formed to pass through the silicon oxide film 14 and the gate oxide film 12, and wiring segments 21, 22 extend through the contact holes 19, 20, respectively.

Next, a method of manufacturing the semiconductor device in the present embodiment will be explained.

Figure 1:
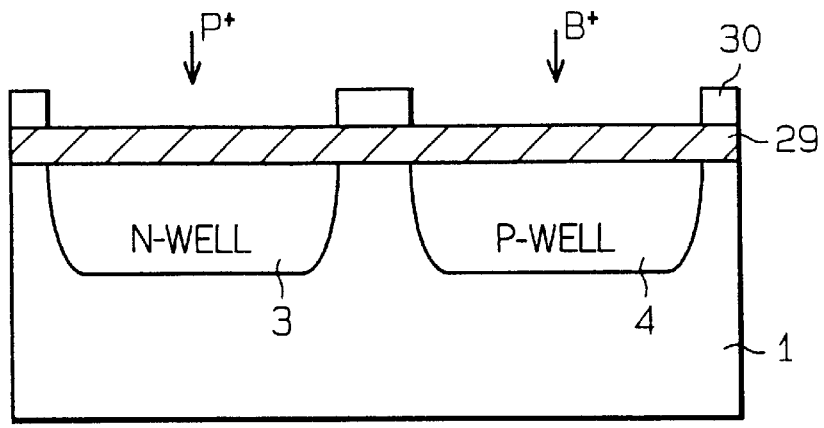
FIG. 1 is a cross-sectional view for explaining a manufacturing step of a semiconductor device in a preferred embodiment.

First, as shown in FIG. 1, the single crystal silicon substrate 1 is prepared, and a thermally oxidized film 29 is formed on the single crystal silicon substrate 1. Then, an ion-implantation mask 30 for forming well regions is formed on the thermally oxidized film 29 by photo-lithography, and ion-implantation is carried out to form the well regions. That is, phosphorus (P) is implanted with a dose of $1 \times 10^{13}$ atoms/cm$^2$ to form the N-well region 3, and boron (B) is implanted with a dose of $3.4 \times 10^{13}$ atoms/cm$^2$ to form the P-well region 4.

Figure 2:
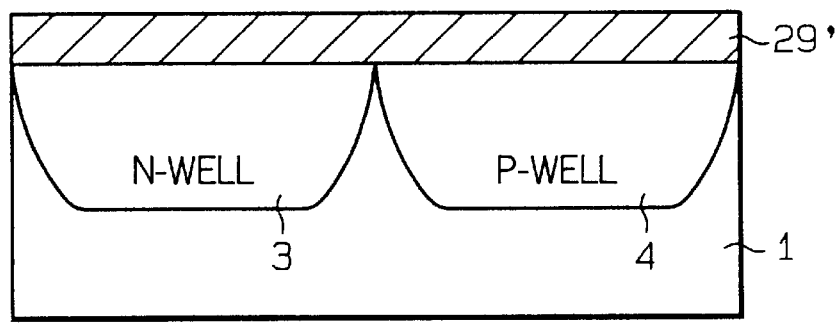
FIG. 2 is a cross-sectional view for explaining a manufacturing step of the semiconductor device.
Figure 10:
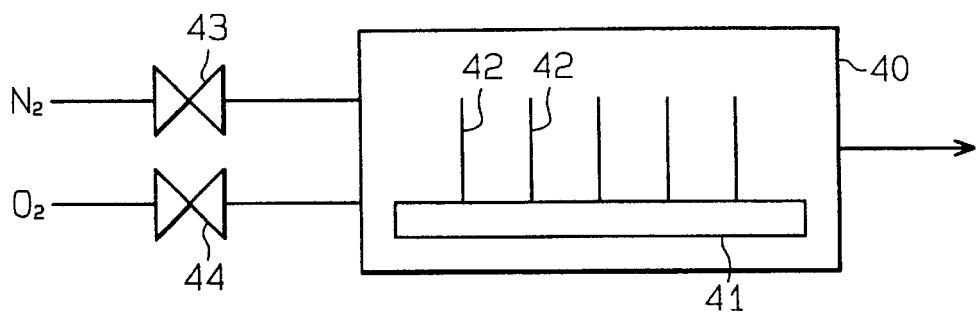
FIG. 10 is a schematic view showing an annealing apparatus.
Figure 11:
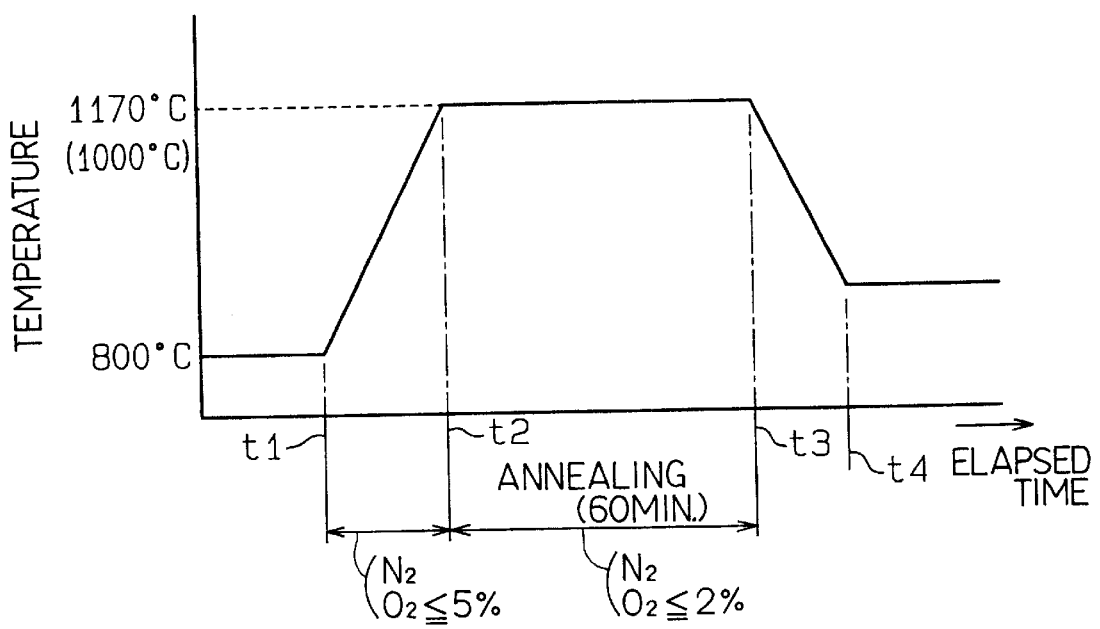
FIG. 11 is a chart showing a temperature recipe for annealing.

After that, as shown in FIG. 2, annealing is carried out within a furnace while supplying inert gas together with oxygen, in order to prevent generation of stacking faults (OSFs) on the P-well region 4 at drive-in. Specifically, as shown in FIG. 10, wafers 42 are set onto a base (boat) 41, and are disposed within the furnace 40, into which nitrogen (N$_2$) can be supplied through a valve 43 and oxygen (O$_2$) can be supplied through a valve 44. Then, a temperature inside the furnace 40 is raised as shown in FIG. 11 while supplying nitrogen (N$_2$) and oxygen (O$_2$) into the furnace 40. That is, at timing t1 in FIG. 11, in a state where a supply amount of oxygen is maintained to be equal to or less than 5% (for instance, 1%), the temperature inside the furnace 40 is raised from a specific temperature (for instance, 800° C.) up to a temperature in a range of 950° C. to 1200° C. (for instance, 1170° C.) as indicated with timing t2. Then, in a state where the temperature in the furnace 40 is maintained in the range of 950° C. to 1200° C. (for instance, at 1170° C.) and the supply amount of oxygen is controlled to be equal to or less than 2%, annealing is carried out until timing t3 for a specific time period that is equal to or longer than 15 min. (for instance, 60 min.). After that, the temperature is decreased to a specific temperature as indicated with timing t4.

Thus, in the annealing for preventing stacking faults (OSFs) from being produced on the P-well region 4, oxygen is supplied into the furnace 40 with a supply amount equal to or less than 5% in addition to nitrogen gas when raising the temperature for the heat treatment. Then, the heat treatment is carried out for the specific time period within the furnace into which oxygen is supplied with a supply amount equal to or less than 2% together with nitrogen gas.

Incidentally, the oxide film 29 in FIG. 1 is thickened during this step to be an oxide film 29' shown in FIG. 2. Ion-implanted phosphorus and boron are thermally diffused and are activated, thereby forming the N-well region 3 and the P-well region 4.

Figure 3:
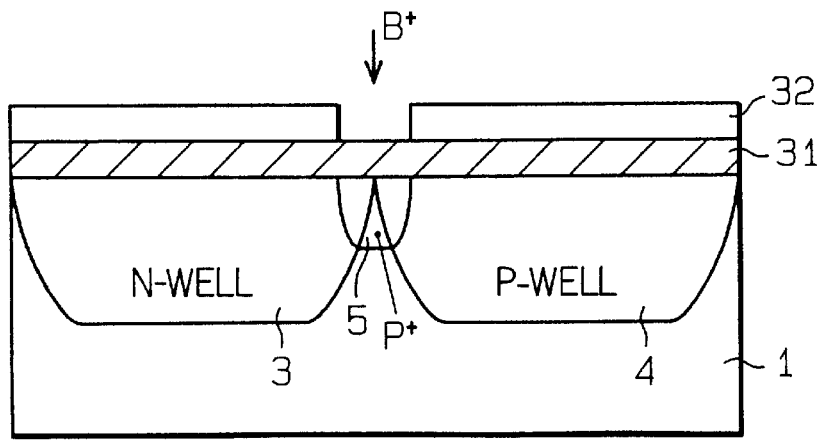
FIG. 3 is a cross-sectional view for explaining a manufacturing step of the semiconductor device.

Successively, after the oxide film 29' is removed, as shown in FIG. 3, a thermally oxidized film 31 is formed on the substrate 1, and a nitride film (Si$_3$N$_4$ film) 32 is deposited on the oxidized film 31 by a low pressure CVD method. The nitride film (Si$_3$N$_4$ film) 32 is then opened at a region, where the channel stopper 5 is to be formed, by photo-lithography, and boron (B) is ion-implanted with a dose of $7 \times 10^{13}$ atoms/cm$^2$.

After that, annealing is further carried out within the furnace including inert gas and oxygen therein to form the channel stopper 5 by activating the ion-implanted boron, and to recover damages caused by the ion-implantation for the channel stopper 5, so that generation of stacking faults (OSFs) is prevented. Specifically, referring again to FIG. 10, after wafers 42 set on the base (boat) 41 are installed in the furnace 40, the temperature inside the furnace 40 is raised while supplying nitrogen (N$_2$) and oxygen (O$_2$) into the furnace 40 as shown in FIG. 11. That is, in FIG. 11, the temperature inside the furnace 40 is raised from a specific temperature (for instance, 800° C.) to a temperature in a range of 950° C. to 1200° C. (for instance, 1000° C.) while supplying oxygen (O$_2$) with a supply amount equal to or less than 5% (for instance, 1%). Then, in a state where the temperature inside the surface 40 is maintained in the range of 950° C. to 1200° C. (for instance, 1000° C.) and the supply amount of oxygen (O$_2$) is controlled to be equal to or less than 2%, annealing is carried out for longer than 15 min. (for instance, for 60 min.). After that, the wafers 42 are cooled.

Thus, in the annealing that is performed while supplying inert gas and oxygen into the furnace in order to prevent stacking faults (OSFs) from being produced on the channel stopper 5, oxygen is supplied together with nitrogen gas into the furnace with an amount equal to or less than 5% when raising the temperature for the heat treatment, and oxygen is supplied together with nitrogen gas into the furnace with an amount equal to or less than 2% during the heat treatment for the specific time period.

Figure 4:
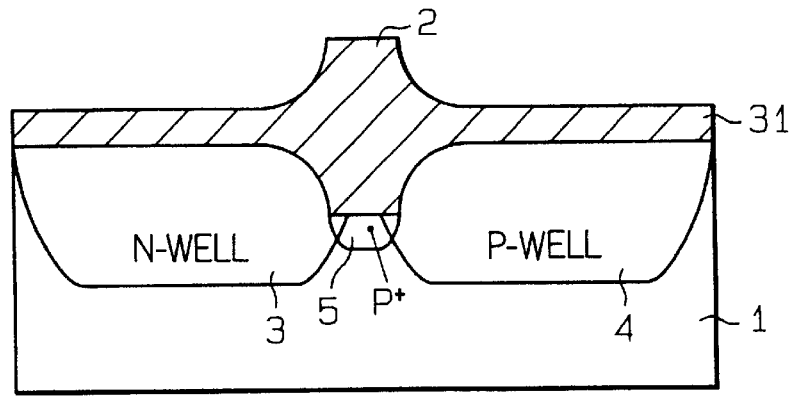
FIG. 4 is a cross-sectional view for explaining a manufacturing step of the semiconductor device.
Figure 5:
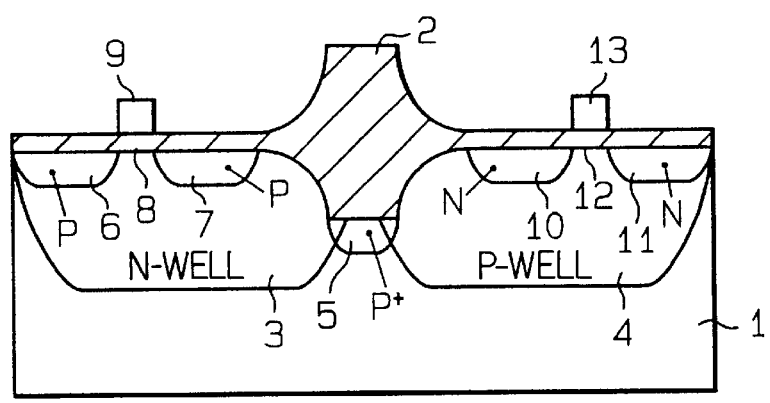
FIG. 5 is a cross-sectional view for explaining a manufacturing step of the semiconductor device.
Figure 6:
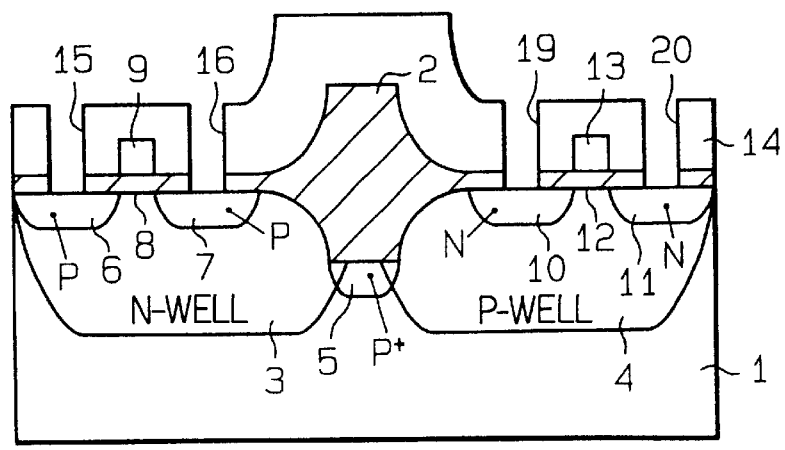
FIG. 6 is a cross-sectional view for explaining a manufacturing step of the semiconductor device.

Successively, as shown in FIG. 4, the LOCOS film 2 is formed in the same furnace 40 by thermal oxidation, and the nitride film 32 and region of the oxide film 31 other than the LOCOS film 2 are removed. After that, as shown in FIG. 5, the gate oxide films 8, 12 are formed by additional thermal oxidation, and the gate electrodes 9, 13 are disposed on the gate oxide films 8, 12. The source regions 6, 10 and the drain regions 7, 11 are formed by ion-implanting P-type impurities and N-type impurities respectively into the N-well region 3 and the P-well region 4 using the gate electrodes 9, 13 as masks. Further, as shown in FIG. 6, the silicon oxide film (BPSG film) 14 is formed on the substrate 1 by the CVD method, and the contact holes 15, 16, 19, 20 are formed through a reflow step. Then, as shown in FIG. 7, the wiring segments 17, 18, 21, 22 are formed, and finally a protective film (not shown) is formed. Consequently, the manufacture of the semiconductor device is finished.

Figure 8:
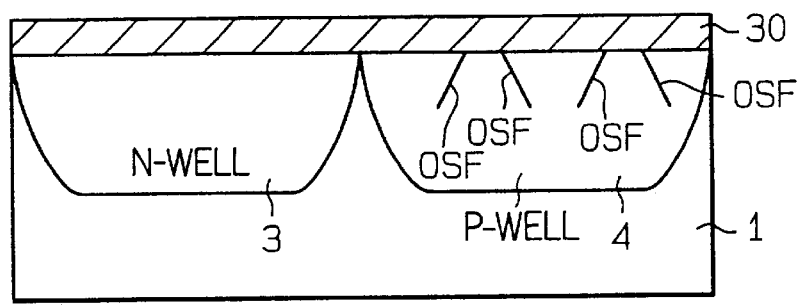
FIG. 8 is a cross-sectional view showing the semiconductor device.

In the manufacturing process described above, because the annealing is carried out while supplying oxygen into the furnace at the drive-in step for forming the well regions, stacking faults (OSFs) are prevented from being generated. That is, in a case where the annealing using oxygen is not carried out, as shown in FIG. 8 that corresponds to FIG. 2, stacking faults are produced in the P-well region 4. To the contrary, when the annealing is carried out while supplying oxygen, as shown in FIG. 2, stacking faults (OSFs) are hardly produced in the P-well region 4.

Figure 9:
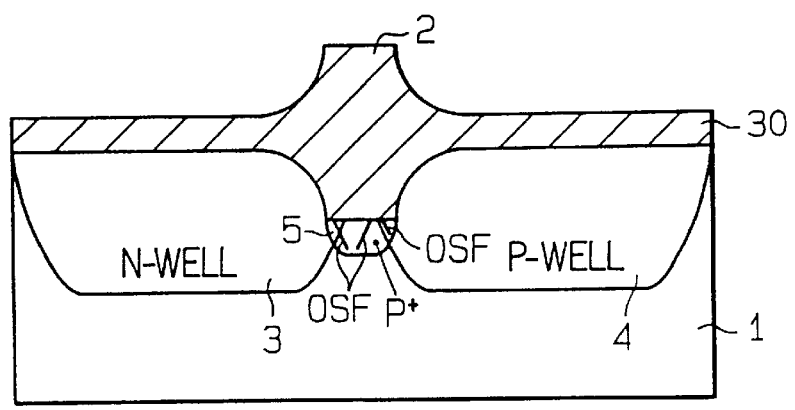
FIG. 9 is a cross-sectional view showing the semiconductor device.

Also, because the annealing is carried out while supplying oxygen into the furnace after the ion-implantation for the channel stopper 5, stacking faults are prevented from being generated. That is, in a case where the annealing using oxygen is not carried out, as shown in FIG. 9 that corresponds to FIG. 4, stacking faults (OSFs) are produced in the P type channel stopper 5 when the LOCOS film 2 is formed. To the contrary, when the annealing is carried out while supplying oxygen, as shown in FIG. 4, stacking faults (OSFs) are hardly produced in the P-type channel stopper 5. In this way, after various defects (damage by the ion-implantation, voids, vacancies, oxidized depositions, and the like) are removed or made to be harmless, oxidation treatments are carried out. As a result, the generation of various crystal defects can be prevented.

Herebelow, various experiments performed by the inventors will be explained in detail.

The experiments employed the following samples and evaluation methods. An oxygen annealing sample used in the experiments was obtained by forming a thermally oxidized film with a thickness of 425 Å on a silicon substrate, implanting boron (B) ions at 60 keV with a dose of $7\times10^{13}$ ($cm^{-2}$), and successively annealing while supplying oxygen at 1000° C. for 1 hour. Further, a non-annealing sample, to which the annealing using oxygen was not carried out (with oxygen at 1000° C. for 1 hour), was prepared. Then, after oxide films, each thickness of which was 9500 Å, were respectively formed on the two samples, the oxide films were removed from the samples (specifically by HF). Then, OSF densities of the two samples were measured by seco-etching (with $K_2Cr_2O_7$: 2.25 g, relative to a mixture of HF: 100cc, $H_2O$: 50 cc).

Figure 12:
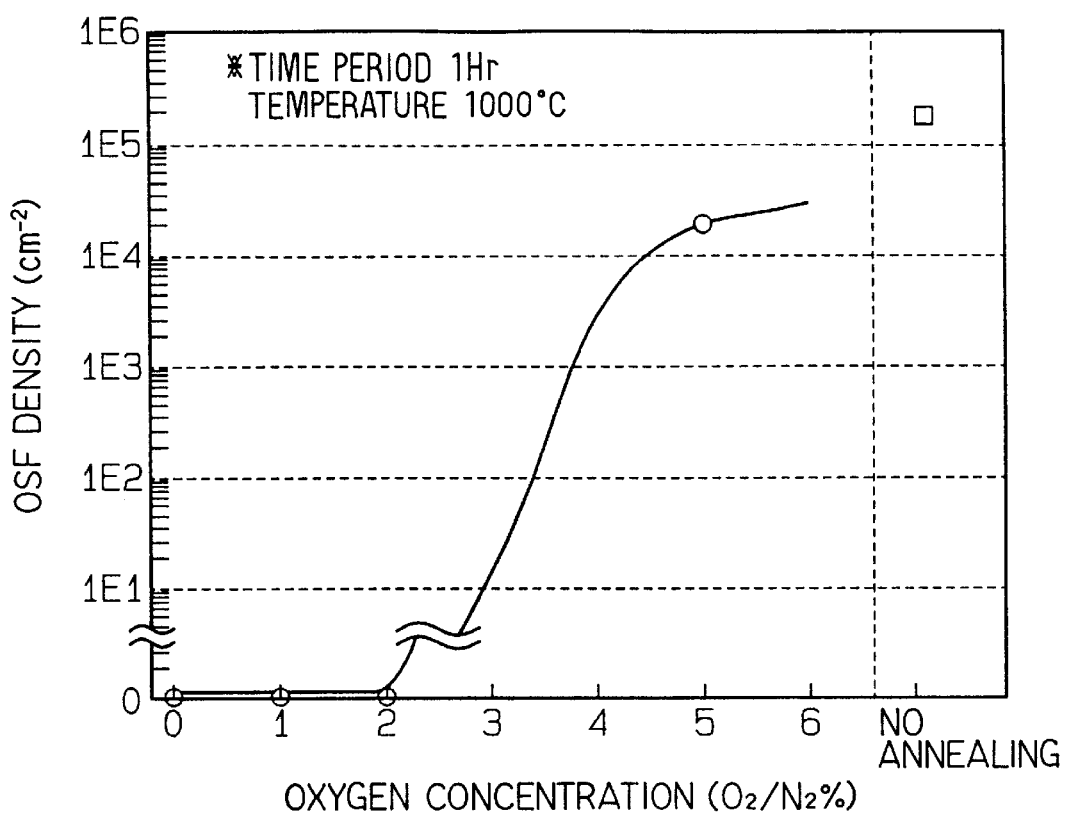
FIG. 12 is a graph showing a relationship between supplied oxygen concentrations during the annealing and OSF densities.

FIG. 12 shows a relationship between oxygen concentrations at the annealing carried out in the time period of t2-t3 in FIG. 11 and OSF densities. In FIG. 12, a horizontal axis indicates the oxygen concentrations ($O_2/N_2\%$), and a vertical axis indicates the OSF densities.

As shown in FIG. 12, when the annealing was not carried out under the supply of oxygen, OSFs were generated with a density of $2\times10^5$ ($cm^{-2}$). When the oxygen concentration was 5%, OSFs were generated with a density of $2\times10^4$ $cm^{-2}$. As opposed to this, it was found that OSFs were hardly generated when the oxygen concentration was equal to or less than 2%. Incidentally, in the case where the oxygen concentration was 0%, the generation of OSFs was prevented; however, as disclosed in JP-A-61-8931, in such a case, other defects (thermal-bits) may be produced to decrease yield. Therefore, oxygen is mixed to prevent the Si surface and the oxide film surface from being undesirably nitrized (at areas that are not basically required to be nitrized) during the annealing, and to prevent the surfaces from being roughened.

Further, it is presumed that the effect for preventing OSFs is enhanced by taking defects, which are to be nuclei of OSFs, into the grown oxide film during the annealing that is carried out while supplying oxygen.

Thus, defects (for instance, oxidized depositions), which can be nuclei of OSFs in the Si crystal to cause OSFs, disappear, or are brought to be harmless by controlling the oxygen concentration during the annealing, thereby suppressing the generation of OSFs. In addition, oxygen introduced into the atmosphere performs a gettering function to prevent invasion of contaminations from the atmosphere. This is especially effective when the wafers are transferred (loaded) into the furnace along with atmospheric air including contaminations.

Figure 13:
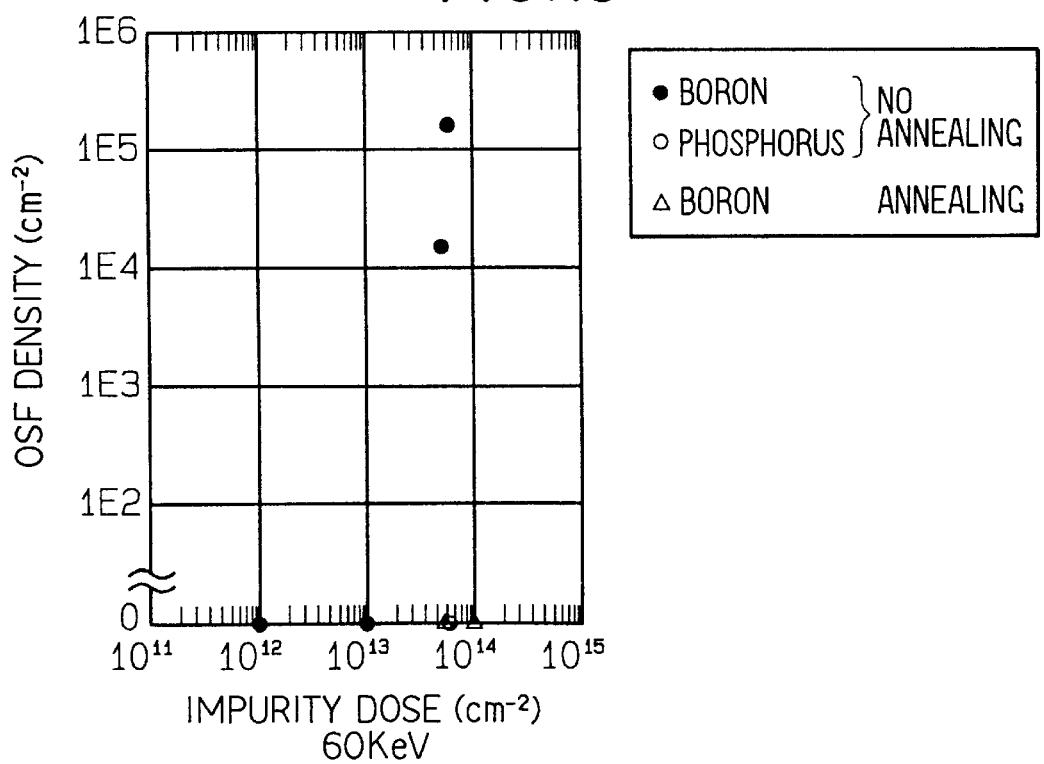
FIG. 13 is a graph showing a relationship between ion-implantation conditions and OSF densities.

FIG. 13 shows a relationship between ion-implantation conditions and OSF densities. A horizontal axis of FIG. 13 indicates impurity doses, while a vertical axis of FIG. 13 indicates OSF densities. Boron and phosphorus were used as impurities, and OSF densities were measured in two cases where annealing was carried out while supplying oxygen and annealing was not carried out while supplying oxygen. The annealing was carried out at 1000° C. for 60 minutes with a supply amount of oxygen of 1%. Boron was implanted at 60 KeV.

According to FIG. 13, it is found that the annealing is effective especially to OSFs produced by damages (nuclei capable of causing OSFs), which are produced by the ion-implantation of boron. Specifically, in the case where the annealing is not carried out while supplying oxygen, OSFs start to be produced when the boron ion dose exceeds $1\times10^{13}$ ($cm^{-2}$). To the contrary, when the annealing is carried out while supplying oxygen, OSFs are hardly produced even when the boron ion dose exceeds $1\times10^{13}$ ($cm^{-2}$). Thus, the generation of OSFs can be prevented by the annealing that is carried out while supplying oxygen after the ion-implantation of boron ions and before oxidation.

On the other hand, when the ion kind is phosphorus, OSFs are hardly produced even when the annealing is not performed while supplying oxygen before oxidation. This is because a size of a phosphorus atom is extremely close to the size of a Si atom. It is presumed that distortions among crystal lattices caused by phosphorus atoms are so small that they do not become nuclei of OSFs. A boron atom is smaller than that of Si. Therefore, it is considered that ion-implanted boron produces nuclei that can be grown as OSFs by oxidation, resulting in generation of OSFs. Other impurities such as As and Sb have atomic sizes different from that of a silicon atom, so that they can produce nuclei of OSFs. Therefore, in such as case, OSFs can be produced when the annealing is not carried out before oxidation. That is, the method of the present invention is effective in the cases where ions of elements that belong to groups far from Si in the periodic table are implanted as impurities.

Figure 14:
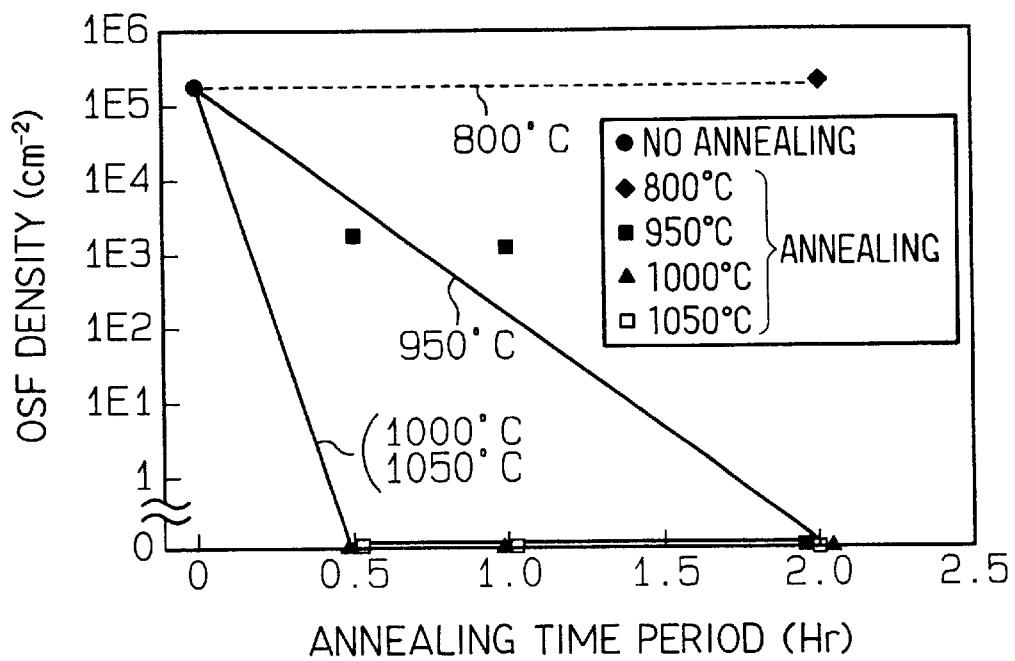
FIG. 14 is a graph showing relationships of OSF densities relative to annealing time periods and annealing temperatures.

FIG. 14 shows relationships of OSF densities relative to annealing time periods and annealing temperatures. A horizontal axis of FIG. 14 indicates annealing time periods, while a vertical axis of FIG. 14 indicates OSF densities. FIG. 14 shows, as measurement conditions, cases where the annealing was not carried out while supplying oxygen, the annealing was carried out at 800° C., the annealing was carried out at 950° C., the annealing was carried out at 1000° C., and the annealing was carried out at 1050° C.

As shown in FIG. 14, it is known that annealing conditions (time period and temperature) of the annealing carried out under the supply of oxygen are important to suppress OSFs. That is, the OSF suppression effect starts to exhibit from the annealing temperature of 950° C. An effective temperature for carrying out the annealing under the supply of oxygen is equal to or higher than 1000° C.

Figure 15:
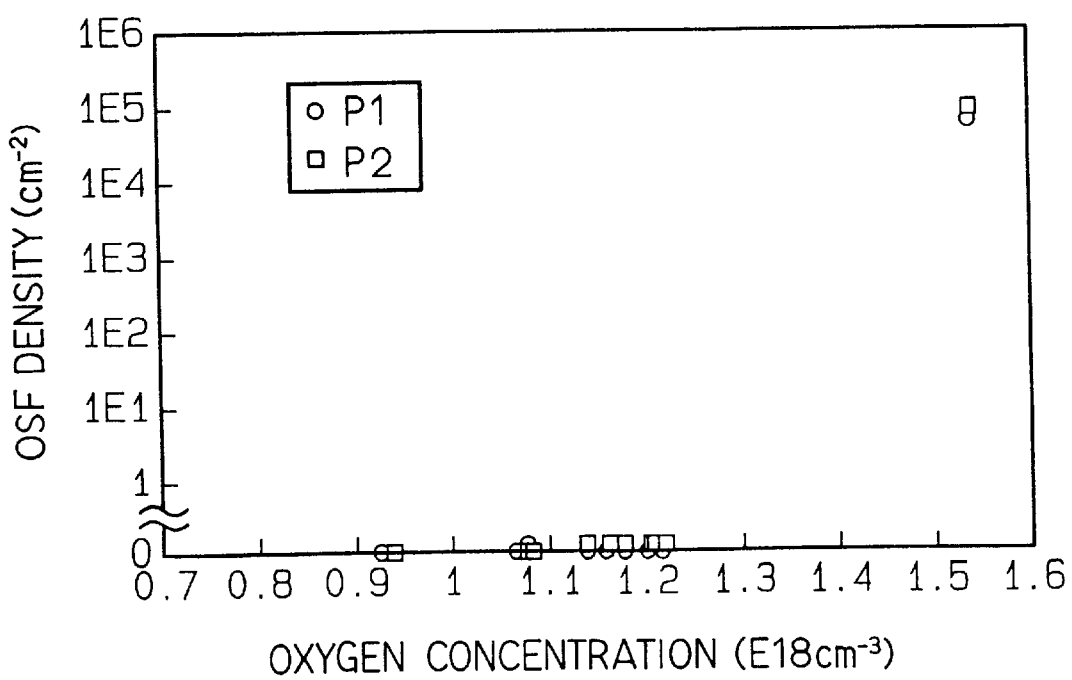
FIG. 15 is a graph showing a relationship between oxygen concentrations in a wafer (raw material) and OSF densities.
Figure 17:
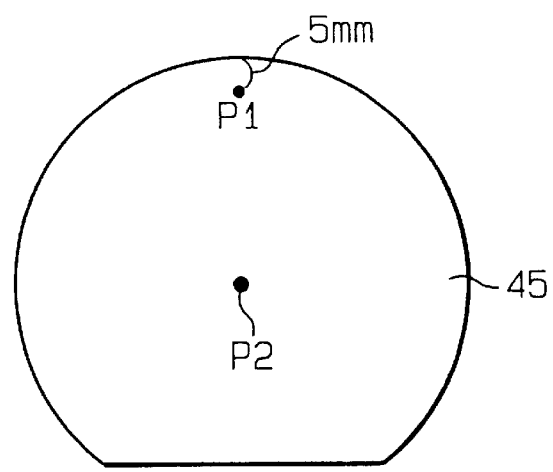
FIG. 17 is a plan view of the wafer.

FIG. 15 shows a relationship between oxygen concentrations in a wafer (raw material) and OSF densities. A horizontal axis of FIG. 15 indicates the oxygen concentrations of the wafer, and a vertical axis of FIG. 15 indicates OSF densities. As shown in FIG. 17, OSF densities were measured at two points P1, P2 of the wafer 45. The point P1 is a top portion, a distance from an outer circumference of the wafer is 5 mm, and point P2 is the central portion of the wafer 45. According to FIG. 15, it is known that the generation of OSFs strongly depends on the oxygen concentrations in the wafer. It is preferable that the annealing is carried out to the wafer having the oxygen concentration equal to or less than $1.2 \times 10^{18}$ (cm$^{-3}$).

Figure 16:
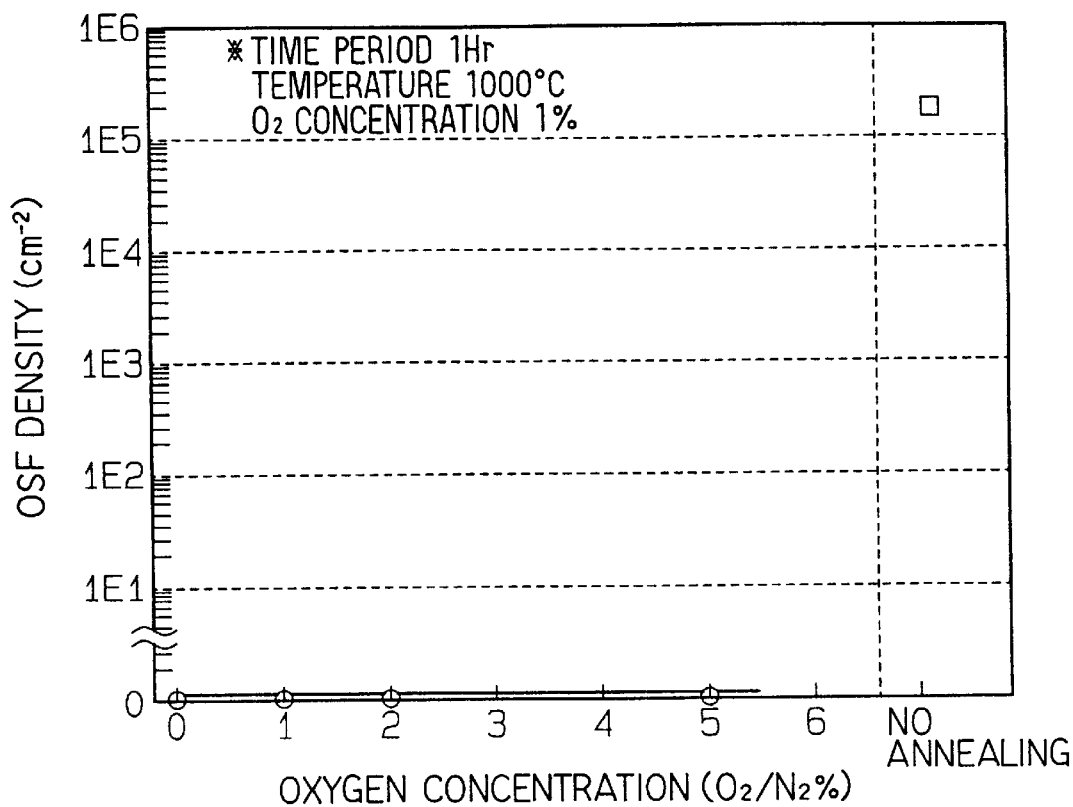
FIG. 16 is a graph showing a relationship between supplied oxygen concentrations when rising a temperature and OSF densities.

FIG. 16 shows a relationship between oxygen concentrations when raising the temperature during t1-t2 of FIG. 11, and OSF densities. A horizontal axis of FIG. 16 indicates the oxygen concentrations when raising the temperature, and a vertical axis of FIG. 16 indicates the OSF densities. As measurement conditions, the annealing at t2-t3 of FIG. 11 was carried out for 1 hour, at 1000° C., with the oxygen concentration of 1% (nitrogen concentration of 99%).

In the annealing that is carried out while supplying oxygen (at t2-t3 in FIG. 11), as mentioned above referring to FIG. 12 and other drawings, the oxygen concentration should be set to be equal to or less than 2%. However, according to FIG. 16, it is known that the oxygen concentration can be increased up to 5% when raising the temperature at t1-t2 in FIG. 11 to prevent the generation of OSFs. The gettering function by oxygen can prevent contaminations by increasing the oxygen concentration even when atmospheric air is introduced into the furnace.

Thus, the present embodiment has the following features.

(1) The method of manufacturing the semiconductor device includes the step for forming the oxide film 31 shown in FIG. 3 that is performed after the ion-implantation is carried out to form the P-well region 4 in the silicon substrate 1. In the method, the silicon substrate 1 undergoes the heat treatment (annealing) within the furnace for a specific time period before the oxide film 31 is formed and after the ion-implantation is carried out. During the heat treatment and during the rise in temperature up to the heat treatment temperature, oxygen is supplied into the furnace together with nitrogen gas (inert gas). Accordingly, crystal defects (OSFs) are effectively prevented from being produced on the surface of the P-well region 4 at the LSI manufacturing step.

The method of manufacturing the semiconductor device further includes the step of forming the LOCOS film 2 as shown in FIG. 4 after the ion-implantation is carried out to form the P-type channel stopper 5 into the silicon substrate 1 as shown in FIG. 3. In the method, the silicon substrate 1 undergoes the heat treatment (annealing) within the furnace for a specific time period before the LOCOS film 2 is formed, and after the ion-implantation is carried out. During the heat treatment for the specific time period, and during the rise in temperature up to the heat treatment temperature, oxygen is supplied into the furnace together with nitrogen gas (inert gas). Accordingly, crystal defects (OSFs) are effectively prevented from being generated on the surface of the P-type channel stopper 5 in the LSI manufacturing step.

(2) The ambient temperature in the heat treatment of the specific time period is equal to or higher than 950° C. Accordingly, as shown in FIG. 14, the OSF density is decreased to suit practical use.

(3) A supply amount of oxygen in the heat treatment for the specific time period is equal to or less than 2%. Accordingly, as shown in FIG. 12, the OSF density is decreased to suit the practical use.

(4) The specific time period of the heat treatment is equal to or longer than 15 minutes. Accordingly, as shown in FIG. 14, the OSF density is decreased to suit the practical use.

(5) The supply amount of oxygen during the rise in temperature up to the heat treatment temperature is equal to or less than 5%. Accordingly, as shown in FIG. 16. the OSF density is decreased to suit the practical use. Also, since the supply amount of oxygen during the rise in temperature can be increased, the supplied oxygen can prevent contamination that is caused by atmospheric air introduced into the furnace when loading the wafers, by the gettering function thereof.

(6) The oxide film is formed by performing oxidation within the same furnace after the heat treatment is carried out for the specific time period. This is preferable for the practical use. That is, the annealing and the oxidation are successively performed using the same furnace for the OSF suppression annealing, resulting in shortening of the process. In other words, it is preferable that the recipe for forming the oxide film includes the annealing.

In this way, the present embodiment provide various advantages, and accordingly, the LSI can be manufactured without producing OSFs therein. The specific advantages are:

1. to improve yield of products;
2. to improve withstand voltage yield of the gate oxide film;
3. to improve reliability of the gate oxide film due to the point 2 described above;
4. to decrease a burn-in deficiency rate; and
5. to shorten a burn-in time period.

In this way, according to the method in the present embodiment, the oxidation is carried out after various defects capable of causing oxidation induced stacking faults (OSFs) are eliminated or brought to be harmless. As a result, the generation of the stacking faults (OSFs) is suppressed.

An occurrence mechanism of oxidation induced stacking faults (OSFs) is considered as follows. That is, when an oxide film is formed by an oxidation heat treatment, a large amount of interstitial silicon (SiI) is discharged (2Si+ 2O→SiO$_2$+SiI) from an oxide film/silicon interface due to volume expansion at a portion adjacent to the wafer surface. At that time, when defects (oxygen in the bulk, dangling bonds of Si atoms, vacancies, ion impact defects, and the like) exist as nuclei due to some local distortion, interstitial silicon atoms gather around the nuclei, and produce oxidation induced stacking faults (OSFs).

In the present embodiment, preheating (annealing), which is the OSF suppression annealing, is carried out under inert gas atmosphere added with oxygen with a specific amount, before the oxidation step. Accordingly, the defects capable of functioning as nuclei of OSFs are taken into the oxide film to disappear, or to be brought to be harmless by oxidation caused by the introduced oxygen, thereby securely preventing the generation of OSFs.

Concerning the amount of supplied oxygen, when the amount of oxygen is excessive, the generation of interstitial Si is facilitated due to the oxidation by the oxygen. In this case, part of the interstitial Si is taken into the oxide film; however, the other of the interstitial Si is left over, and gathers around the defects as nuclei of OSFs before the defects disappear or brought to be harmless. In addition, defects capable of serving as nuclei of OSFs can be further produced due to distortion caused by volume expansion at the oxide film growth.

To the contrary, when the oxygen concentration is controlled to be equal to or less than 2% (equal to or less than 5% when raising the temperature) as in the present embodiment, it is considered that recover of interstitial Si by annealing is balanced with generation of interstitial Si or surpasses the generation of interstitial Si. Otherwise, it is considered that the nuclei of OSFs are taken into the growing oxide film more quickly than the growth of OSFs that starts after interstitial Si gathers around the nuclei. As a result of these phenomena, the generation of OSFs is suppressed.

That is, in the present embodiment, defects existing around the surface as nuclei are previously eliminated or brought to be harmless by recovering or taking into the oxide film by the OSF suppressing annealing. Therefore, even when interstitial Si is excessively produced at the following main oxidation, the generation of OSFs can be prevented since the nuclei around the surface are eliminated.

Also, since oxygen is supplied into the atmosphere at the OSF suppression annealing in the present embodiment, the surface is prevented from being nitrized and being roughened during the annealing. It is presumed that thermal bits produced by the nitridation further constitute nuclei of OSFs. Therefore, also from this point, it is advantageous to prevent OSFs by controlling the amount of oxygen in the specific range at the annealing. In addition, because the optimum temperature of the preheating (annealing) is set in a range of 950° C. to 1200° C., the generation of OSFs is more securely suppressed.

The embodiment described above may be changed as follows.

In the embodiment described above, the oxide film 29 is formed to mitigate ion impact or to serve as a cap at the drive-in step, before the ion-implantation for forming the well region; however, the ion-implantation may be performed in the state where the silicon substrate surface is exposed. An annealing (drive-in) recipe in the case will be explained referring to FIG. 18.

Figure 18:
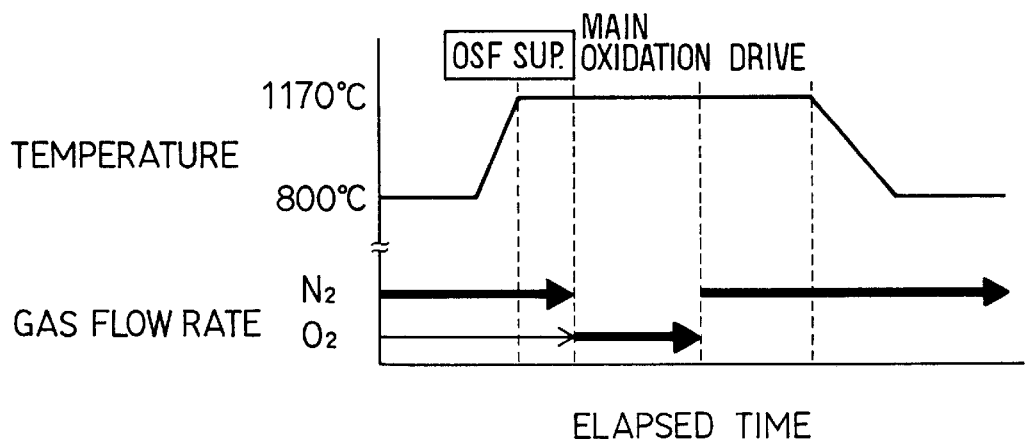
FIG. 18 is a chart showing another temperature recipe at annealing (drive-in)

As described above referring to FIG. 10, the wafers 42 are set on the base (boat) 41, and disposed within the furnace 40. Then, as shown in FIG. 18, the temperature inside the furnace 40 is raised while supplying nitrogen ($N_2$) and oxygen ($O_2$) into the furnace 40. That is, in FIG. 18, the temperature inside the furnace is raised from a specific temperature (for instance, 800° C.) to a temperature in a range of 950° C. to 1200° C. (for instance, 1170° C.) in the state where a supply amount of oxygen is controlled to be equal to or less than 5%. Further, while keeping the temperature inside the furnace at 950° C. to 1200° C. (for instance, 1170° C.), initial annealing is first carried out for 15 minutes or more in the state where the supply amount of oxygen ($O_2$) is controlled to be equal to or less than 2%. Nuclei capable of generating OSFs disappear or are brought to be harmless by the initial annealing, and at the same time, an oxide film grows to be part of a cap layer at thermal diffusion. Then, as shown in FIG. 18, main oxidation is successively carried out with oxygen ($O_2$), a supply amount of which is 100%. After that, drive is carried out with nitrogen ($N_2$), a supply amount of which is 100%, and the temperature is lowered to the specific temperature, thereby unloading. In this case, likewise, OSFs are prevented from being generated in the P-well region 4.

Also, in the embodiment descried above, the OSF suppression annealing is carried out before the LOCOS oxidation step, in a different recipe from the LOCOS oxidation step so that OSFs are not generated at the LOCOS oxidation step. However, the OSF suppression annealing may be carried out in the same recipe as the LOCOS oxidation step, provided that an amount of oxygen introduced at an initial state of the LOCOS oxidation step is suppressed. The recipe of the LOCOS oxidation step in the case described above will be explained referring to FIG. 19.

Figure 19:
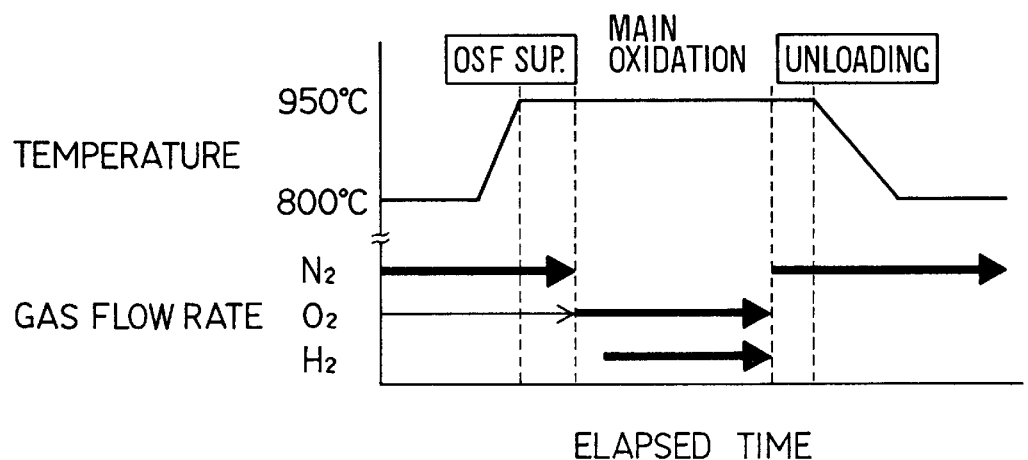
FIG. 19 is a chart showing another temperature recipe at annealing (LOCOS oxidation).

The base (boat) holding the wafers is loaded into an oxidation furnace (having a structure similar to that shown in FIG. 10), into which nitrogen ($N_2$), oxygen ($O_2$), and hydrogen ($H_2$) can be introduced. Then, a temperature inside the furnace is raised as shown in FIG. 19 while supplying nitrogen ($N_2$) and oxygen ($O_2$) into the furnace. That is, in FIG. 19, the temperature inside the furnace is raised from a specific temperature (for instance, 800° C.) up to 950° C. to 1200° C. (for instance, 950° C.), in the state where the supply amount of oxygen ($O_2$) is controlled to be equal to or less than 5%. Then, initial annealing is carried out for 15 minutes or more in the sate where the temperature inside the furnace is kept at 950° C. to 1200° C. (for instance, 950° C.), and the supply amount of oxygen ($O_2$) is controlled to be equal to or less than 2%. The initial annealing eliminates nuclei of OSFs, or makes the nuclei to be harmless. After that, supply of nitrogen ($N_2$) is stopped, and supply of hydrogen ($H_2$) is started after the atmosphere inside the furnace becomes stable. In this state, wet oxidation is carried out as main oxidation. After that, the supply amount of nitrogen ($N_2$) is controlled to be 100%, and the furnace is cooled down to a specific temperature, thereby unloading. According to this process, likewise, OSFs can be prevented from being generated during the LOCOS oxidation.

Also, in the embodiment described above, as shown in the recipe of FIG. 11, oxygen is supplied into the furnace together with nitrogen gas (inert gas) at both steps of raising the temperature and performing the heat treatment at a constant temperature for a specific time period. However, oxygen may be supplied into the furnace together with nitrogen gas (inert gas) at either one of the steps of raising the temperature and performing the heat treatment at the constant temperature for the specific time period.

The OSF suppression annealing step, i.e., the annealing carried out while supplying oxygen, is performed after the drive-in step for forming the well region, and after the ion-implantation of the channel stopper; however, it may be applied to a case where only one of the steps is carried out. The annealing of the present invention is applicable for a semiconductor device manufacturing method including a step for forming an oxide film that is performed after ion-implantation is carried out to a substrate.

Although the annealing uses nitrogen ($N_2$) as main gas to which oxygen is added with several %, other inert gases such as Ar, Ne, and He can be used in addition to $N_2$. The oxidation step may be performed within the same furnace as the OSF suppression annealing step, i.e., as the annealing carried out while supplying oxygen, or may be performed within a different furnace from the annealing.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A method of manufacturing a semiconductor device comprising the steps of:
   implanting ions into a silicon substrate; and
   oxidizing said ion-implanted silicon substrate to form a field oxide film and a channel-stopper region disposed under said field oxide film simultaneously, said channel-stopper region being formed by diffusing said implanted ions, wherein said oxidizing step includes performing, in numerical order, the steps of:
   1) loading into a thermal oxidation furnace said ion-implanted silicon substrate;
   2) ramping a furnace temperature up to a first constant annealing temperature while supplying an oxygen-deficient gas into said furnace, an oxygen concentration with respect to an inert gas being controlled to be 5% or less;

3) performing a first annealing on said silicon substrate at said first constant annealing temperature while supplying an oxygen-deficient gas into said furnace, an oxygen concentration with respect to an inert gas being controlled to be 2% or less;

4) performing a second annealing on said silicon substrate at a second constant annealing temperature while supplying an oxidizing gas into said furnace; and 5) ramping said furnace temperature down and unloading said silicon substrate.

2. A method according to claim 1, wherein said first constant annealing temperature is set in a range from 950° C. to 1,200° C.

3. A method according to claim 1, wherein the duration of said first annealing step is at least 15 minutes.

4. A method according to claim 2, wherein said first constant annealing temperature and said second constant annealing temperature are the same.

5. A method according to claim 1, wherein said second annealing step comprises a first step in which said oxidizing gas consists of oxygen and a second step in which said oxidizing gas consists of a mixture of oxygen and hydrogen.

6. A method according to claim 1, wherein said implanted ions contain boron.

* * * * *